(12) United States Patent
Elliott

(10) Patent No.: US 11,448,687 B2
(45) Date of Patent: Sep. 20, 2022

(54) METHOD AND APPARATUS FOR DETECTING AN ELECTRICAL FAULT IN A PRINTED CIRCUIT BOARD

(71) Applicant: GE Aviation Systems Limited, Cheltenham (GB)

(72) Inventor: David Alan Elliott, Gloucester (GB)

(73) Assignee: GE Aviation Systems Limited, Gloucestershire (GB)

( * ) Notice: Subject to any disclaimer, the term of this patent is extended or adjusted under 35 U.S.C. 154(b) by 160 days.

(21) Appl. No.: 16/325,411

(22) PCT Filed: Aug. 11, 2017

(86) PCT No.: PCT/EP2017/070440
§ 371 (c)(1),
(2) Date: Feb. 14, 2019

(87) PCT Pub. No.: WO2018/033485
PCT Pub. Date: Feb. 22, 2018

(65) Prior Publication Data
US 2019/0212383 A1  Jul. 11, 2019

(30) Foreign Application Priority Data

Aug. 17, 2016 (GB) ..................... 1614094

(51) Int. Cl.
*G01R 31/28* (2006.01)
*B64F 5/60* (2017.01)
(Continued)

(52) U.S. Cl.
CPC ......... *G01R 31/2818* (2013.01); *B64D 45/00* (2013.01); *B64F 5/60* (2017.01);
(Continued)

(58) Field of Classification Search
CPC ....... G01R 31/2818; G64F 5/60; B64D 45/00; B64D 2045/0085; B64D 2221/00; H05K 1/0268; H05K 1/181; H05K 2201/10181
See application file for complete search history.

(56) References Cited

U.S. PATENT DOCUMENTS 3,711,747 A * 1/1973 Sahara ..................... H02M 5/00
361/41
3,845,356 A * 10/1974 Bullard .................. H02H 9/008
361/52
(Continued)

FOREIGN PATENT DOCUMENTS

DE  102008052467 A1  4/2010
EP      1444733 A2  12/2010
(Continued)

OTHER PUBLICATIONS

Great Britain Search Report and Written Opinion dated Jan. 16, 2017 which was issued in connection with GB 1614094.9 which was filed on Aug. 17, 2016.
(Continued)

*Primary Examiner* — Jeff W Natalini
(74) *Attorney, Agent, or Firm* — McGarry Bair PC

(57) ABSTRACT

A method and apparatus for detecting an electrical fault in a printed circuit board includes a first conductive layer interconnecting a set of electrical components, a second conductive layer connected to an electrical ground, a set of fuses arranged about the printed circuit board, and a fault detection circuit electrically connected to the printed circuit board.

11 Claims, 7 Drawing Sheets

(51) Int. Cl.
    *B64D 45/00*     (2006.01)
    *H05K 1/02*     (2006.01)
    *H05K 1/18*     (2006.01)

(52) U.S. Cl.
    CPC ........... *H05K 1/0268* (2013.01); *H05K 1/181* (2013.01); *B64D 2045/0085* (2013.01); *B64D 2221/00* (2013.01); *H05K 2201/10181* (2013.01)

(56) References Cited

U.S. PATENT DOCUMENTS

| | | | |
|---|---|---|---|
| 5,588,207 | A | 12/1996 | Kawakita |
| 6,147,870 | A | 11/2000 | Pommer |
| 6,198,362 | B1 | 3/2001 | Harada |
| 6,353,540 | B1 | 3/2002 | Akiba et al. |
| 7,109,722 | B2* | 9/2006 | Chamberlin ......... H05K 1/0256 324/541 |
| 2004/0115405 | A1* | 6/2004 | Hoo ..................... B32B 27/308 428/209 |
| 2007/0141381 | A1* | 6/2007 | Suzuki .................... C25D 1/04 428/610 |
| 2008/0143190 | A1* | 6/2008 | Rebbereh ................. H02J 5/00 307/113 |
| 2008/0216298 | A1 | 9/2008 | Dudnikov |
| 2008/0217049 | A1* | 9/2008 | Dudnikov ................ H05K 1/18 174/260 |
| 2014/0306523 | A1* | 10/2014 | Namuduri ............ F02N 11/087 307/10.6 |
| 2016/0157336 | A1 | 6/2016 | Murai et al. |
| 2017/0080883 | A1* | 3/2017 | Yasunori ............... B60R 16/033 |
| 2017/0110871 | A1* | 4/2017 | Foster ..................... H02H 7/26 |

FOREIGN PATENT DOCUMENTS

| | | |
|---|---|---|
| JP | H04204063 A | 7/1992 |
| JP | H07321427 A1 | 12/1995 |
| WO | 2012166900 A2 | 12/2012 |

OTHER PUBLICATIONS

International Search Report and Written Opinion dated Oct. 30, 2017 which was issued in connection with PCTPCT/EP2017/070440 which was filed on Aug. 11, 2017.

\* cited by examiner

METHOD AND APPARATUS FOR DETECTING AN ELECTRICAL FAULT IN A PRINTED CIRCUIT BOARD

BACKGROUND

Electrical power systems, such as those found in an aircraft power distribution system, employ power generating systems or power sources, such as generators, for generating electricity for powering the systems and subsystems of the aircraft. As the electricity traverses electrical bus bars to deliver power from power sources to electrical loads, power distribution nodes dispersed throughout the power system ensure the power delivered to the electrical loads meets the designed power criteria for the loads. Power distribution nodes can, for instance, further provide step-up or step-down power conversion, direct current (DC) to alternating current (AC) power conversion or AC to DC power conversion, or switching operations to selectively enable or disable the delivery of power to particular electrical loads, depending on, for example, available power distribution supply, criticality of electrical load functionality, or aircraft mode of operation, such as take-off, cruise, or ground operations. In some configurations, the power distribution nodes can include electrical power components disposed on printed circuit boards.

BRIEF DESCRIPTION

In one aspect, the present disclosure relates to a printed circuit board including a first conductive layer interconnecting a set of electrical components, a second conductive layer connected to an electrical ground, a third conductive sense layer between the first and second conductive layers, and a fault detection circuit electrically connected to the third conductive sense layer and configured to send a signal representative of a fault when a current traversing the non-conductive material reaches the third conductive sense layer. Non-conductive material separates the first conductive layer from the third conductive sense layer, and the third conductive sense layer from the second conductive layer.

In another aspect, the present disclosure relates to a printed circuit board including a first conductive layer interconnecting a set of electrical components and having a first electric potential, a second conductive layer connected to a second electrical potential different from the first conductive layer, a third conductive sense layer between the first and second conductive layers, and a fault detection circuit electrically connected to the third conductive sense layer and configured to send a signal representative of a fault when a current traversing the non-conductive material reaches the third conductive sense layer. Non-conductive material separates the first conductive layer from the third conductive sense layer, and the third conductive sense layer from the second conductive layer.

In yet another aspect, the present disclosure relates to a method of detecting an electrical fault in a printed circuit board, the method including transmitting a current along a first conductive layer interconnecting a set of electrical components, wherein the first conductive layer at least partially overlies a second conductive sensor layer, and the first conductive layer and the second conductive sensor layer overlies a third conductive layer connected to electrical ground, and wherein the first conductive layer, the second conductive sense layer, and the third conductive layer are isolated from one another by a non-conductive material, sensing current in the second conductive sensor layer by a fault detection circuit connected to the second conductive sensor layer, determining, by the fault detection circuit, an electrical fault in the printed circuit board occurs between the first conductive layer and the third conductive layer when the sensed current satisfies a fault threshold, and generating a signal from a fault detection circuit indicative of the electrical fault.

DETAILED DESCRIPTION

Figure 1:
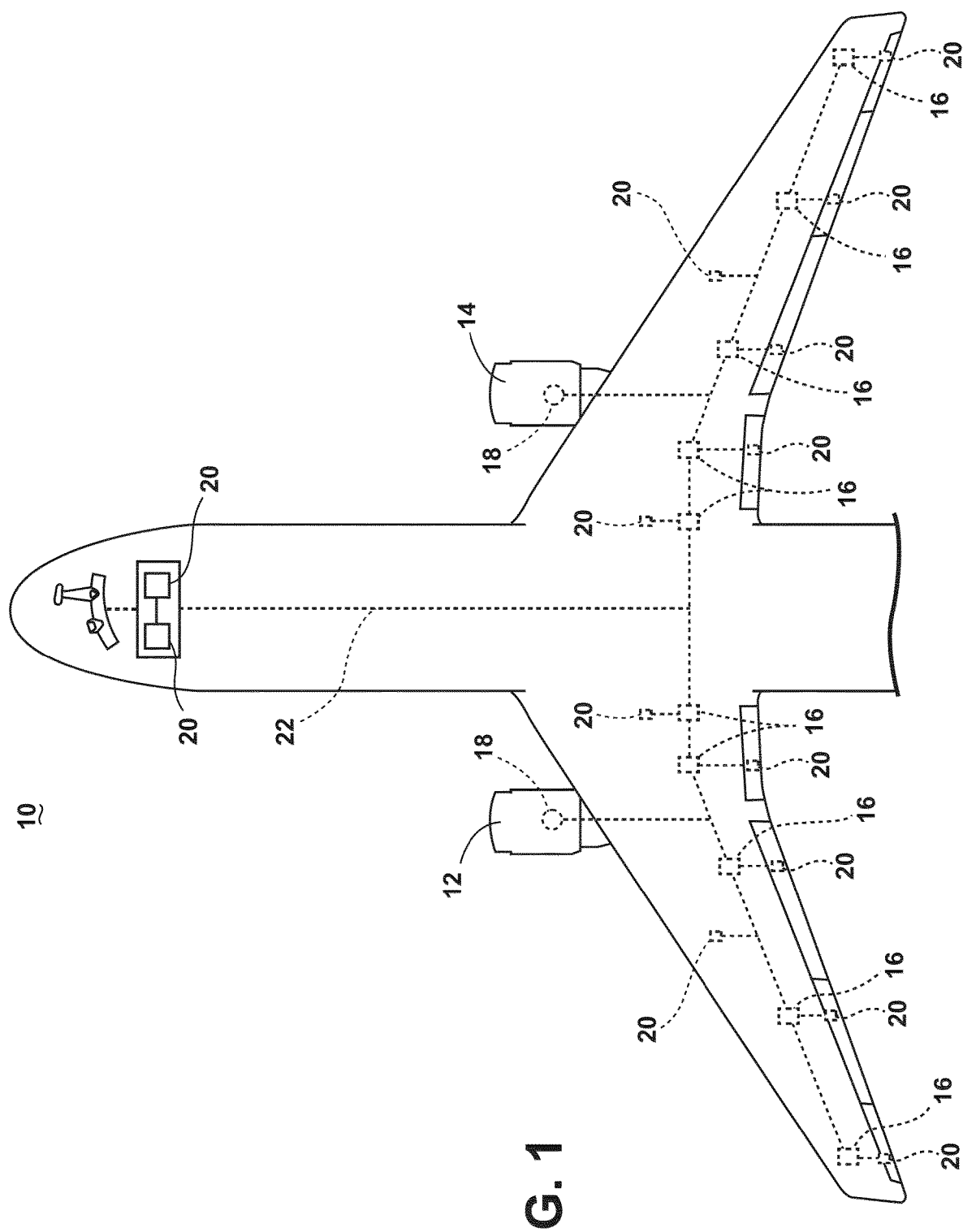
FIG. 1 is a top down schematic view of the aircraft and power distribution system of an aircraft.

The described aspects of the present invention are directed to a method and apparatus associated with detecting an electrical fault or an unintended current transmission in a conductor, including but not limited to, a conductive pathway of a printed circuit board, or the printed circuit board itself. Another non-limiting example environment where such a method and apparatus can be used includes, but is not limited to, a power distribution system for an aircraft, including a power distribution network, and power distribution units. In yet another non-limiting example environment where such a method and apparatus can be used includes solid state power switches or solid state power controllers (SSPCs). While this description is primarily directed toward a power distribution unit for an aircraft and having a circuit board, it is also applicable to any environment using a conductor having at least one non-conductive layer insulating the conductive layer from a grounded current pathway, wherein an electrical fault can occur that results in the grounding of the conductor, or an unintended current transmission between the conductor and the grounded current pathway. For example, aspects of the disclosure described herein are equally applicable to circuit breakers, relays, or related configurations having high power levels (on the order of hundreds of volts), such as power supplies or motor controllers.

As used herein, fuses can be selected or configured to operate according to a "fuse rating" or "trip rating" characteristic, whereby the fuse conducts power when the power conducted is below the fuse rating or "rated" characteristic, but prevents or ceases the conduction of power when the power conducted is above the fuse rating or rated characteristic. Stated another way, the "tripping" or exceeding the rated characteristic of the fuse results in the ceasing of power transmission through the fuse. Non-limiting aspects of the fuses or the fuse rating characteristics can include, but are not limited to characteristics selected or configured to operate with respect to a power characteristic (e.g. voltage or amperes) or a thermal characteristic (e.g. temperature). Additionally, non-limiting aspects of the fuses can include a resettable fuse, such that a tripped fuse can be reset to conduct power, or a permanent fuse, wherein the at least a portion of the fuse is physically destructed when tripped, and the fuse must be replaced.

While "a set of" various elements will be described, it will be understood that "a set" can include any number of the respective elements, including only one element. Additionally, while current or voltage values are described as "sensing" or "measuring" the respective electrical current and voltage characteristics, it is understood that sensing or measuring can include a determination of a value indicative, related to, or representative of the electrical current or voltage characteristics, and not the actual current or voltage values.

Also as used herein, the terms "exceeds" or "satisfies" regarding a threshold value is used to mean that the respective value or values satisfy the predetermined threshold, such as being equal to or less than the threshold value, or being within the threshold value range. For example, if a sensed value falls below a minimum threshold, the value can "exceed" the threshold. It will be understood that such a determination may easily be altered to be satisfied by a positive/negative comparison, exceeding comparison, or a true/false comparison.

Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. The exemplary drawings are for purposes of illustration only and the dimensions, positions, order and relative sizes reflected in the drawings attached hereto can vary.

Also, as used herein, "electrical ground" can include any electrically conductive connection having a different electrical potential from a correspondingly energized conductor. Aspects of the disclosure can include, but are not limited to, electrical grounds such as 0 Volts (direct current), an alternating current out of phase from the energized conductor, a positive voltage, a negative voltage, or the like.

As illustrated in FIG. 1, an aircraft 10 is shown having at least one gas turbine engine, shown as a left engine system 12 and a right engine system 14. Alternatively, the power system can have fewer or additional engine systems. The left and right engine systems 12, 14 can be substantially identical, and can further include at least one power source, such as an electric machine or a generator 18. The aircraft is shown further having a set of power-consuming components, or electrical loads 20, such as for instance, an actuator load, flight critical loads, and non-flight critical loads. The electrical loads 20 are electrically coupled with at least one of the generators 18 via a power distribution system including, for instance, power transmission lines 22 or bus bars, and power distribution nodes 16. It will be understood that the illustrated aspect of the invention of FIG. 1 is only one non-limiting example of a power distribution system, and many other possible aspects and configurations in addition to that shown are contemplated by the present disclosure. Furthermore, the number of, and placement of, the various components depicted in FIG. 1 are also non-limiting examples of aspects associated with the disclosure.

In the aircraft 10, the operating left and right engine systems 12, 14 provide mechanical energy which can be extracted, typically via a spool, to provide a driving force for the generator 18. The generator 18, in turn, generates power, such as AC or DC power, and provides the generated power to the transmission lines 22, which delivers the power to the power distribution nodes 16, positioned throughout the aircraft 10. The power distribution nodes 16 receive the AC or DC power via the transmission lines 22, and can provide switching, power conversion, or distribution management functions, as needed, in order to provide the desired electrical power to the electrical loads 20 for load operations.

Example power distribution management functions can include, but are not limited to, selectively enabling or disabling the delivery of power (e.g. energizing) to particular electrical loads 20, depending on, for example, available power distribution supply, criticality of electrical load 20 functionality, or aircraft mode of operation, such as take-off, cruise, or ground operations. Additional management functions can be included. Furthermore, additional power sources for providing power to the electrical loads 20, such as emergency power sources, ram air turbine systems, starter/generators, or batteries, can be included, and can substitute for the power source. It will be understood that while one aspect of the invention is shown in an aircraft environment, the invention is not so limited and has general application to electrical power systems in non-aircraft applications, such as other mobile applications and non-mobile industrial, commercial, and residential applications.

Figure 2:
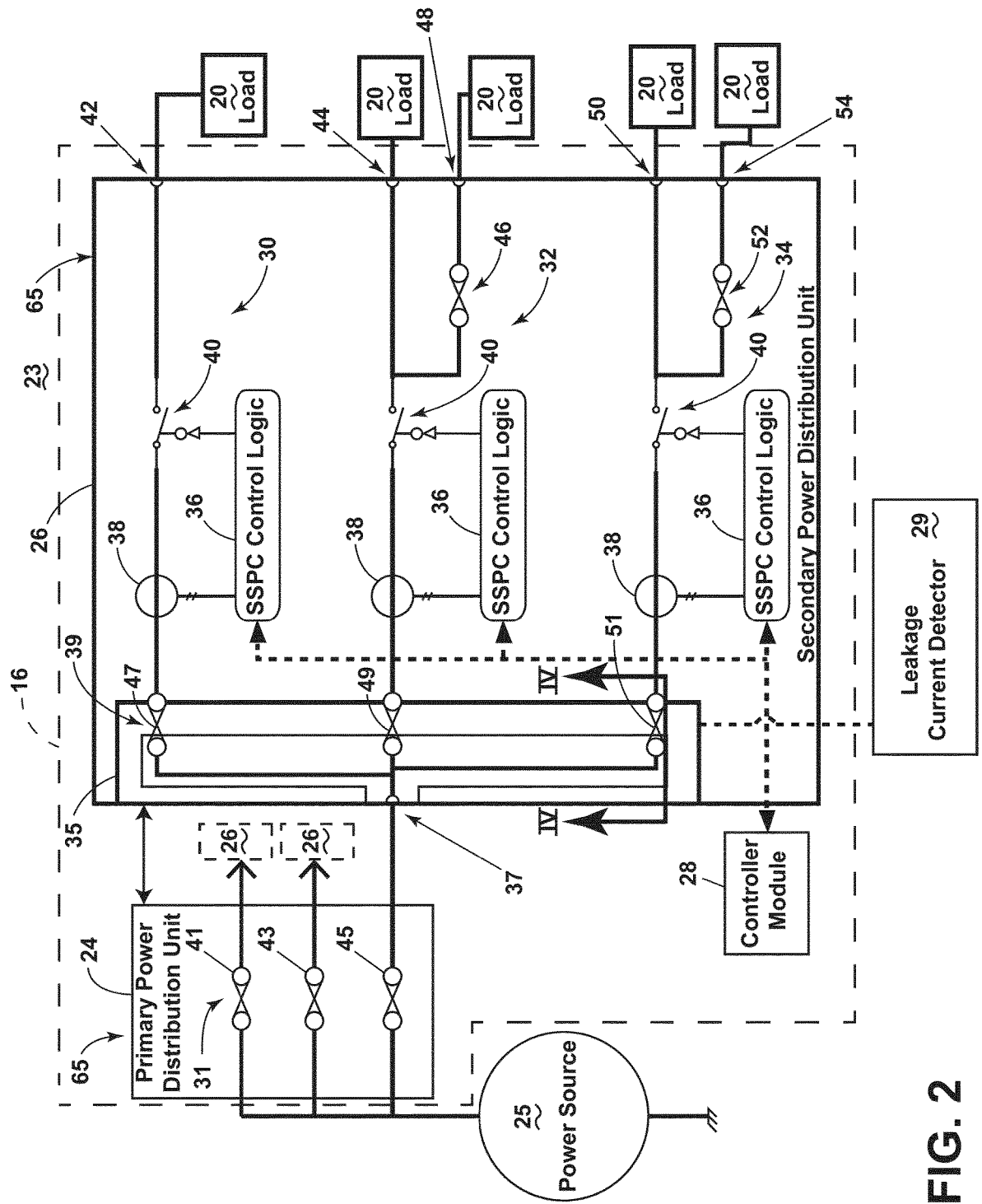
FIG. 2 illustrates an example schematic view of the power distribution system of FIG. 1, in accordance with various aspects described herein.

FIG. 2 illustrates a schematic view of a power distribution system 23 of FIG. 1. As shown, the power distribution system 23 can include, but is not limited to, a power source 25, a set of electrical loads 20, a fault detection circuit, shown as a leakage current detector 29, and the power distribution node 16. The power distribution node 16 can further include, but is not limited to, a primary power distribution unit 24, a secondary power distribution unit 26, and a controller module 28. The power source 25 is conductively coupled with the primary power distribution unit 24, which is further conductively coupled with a set of secondary power distribution units 26. While only a single secondary power distribution unit 26 has been illustrated with schematic details for brevity, the set of secondary power distribution units 26 can be duplicative of the illustrated aspects of the secondary power distribution unit 26 in structure or function. The secondary power distribution unit 26 can be conductively coupled with the set of electrical loads 20 and the leakage current detector 29, and can be communicatively coupled with the controller module 28.

The primary power distribution unit 24 can include, but is not limited to, a first set of fuses 31 interconnecting the power source 25 with the set of secondary power distribution units 26. In the illustrated non-limiting configuration, the first set of fuses 31 can include a first fuse 41, a second fuse 43, and a third fuse 45. In one example configuration, the primary power distribution unit 24 can include a printed circuit board (PCB) 65 or planar circuit board base arranged or configured to carry the aforementioned components. In one non-limited example, the PCB 65 can include a bonding resin, or another effective or operable bonding material. In one aspect, the first set of fuses 31 can correspond to a respective set of secondary power distribution units 26. In another non-limiting aspect, the set of fuses 31 can be selected or configured to operate according to a common fuse rating characteristic, such as 100 Amperes. In another non-limiting aspect, the fuses 41, 43, 45 can be selected or configured to operate at dissimilar fuse ratings based on the desired electrical operation of the power distribution system 23. In yet another non-limiting aspect, the fuses 41, 43, 45 can be selected or configured to limit the maximum power supplied to, or the maximum power demand of the secondary power distribution unit 26, and thus, can in turn at least partially depend on the selection or configuration of the respectively coupled secondary power distribution unit 26.

The secondary power distribution unit 26 can also include a PCB 65 or planar circuit board base and is illustrated in one non-limiting aspect including, carrying, or supporting at least one electrical component, such as a first solid state power controller (SSPC) 30, a second SSPC 32 and a third SSPC 34. The SSPCs are electrically coupled to an upstream power input area 35 receiving an input 37 from the primary power distribution unit 24. The power input area 35 is electrically connected to the input 37, and can include a second set of fuses 39 disposed between the input 37 and the respective set of SSPCs 32, 34, 36. In the illustrated non-limiting aspect, the second set of fuses 39 can include a fourth fuse 47, a fifth fuse 49, and a sixth fuse 51. In this non-limiting aspect of the disclosure, the first SSPC 30 can be electrically coupled with one of the second set of fuses 39, such as the fourth fuse 47, the second SSPC 32 can be electrically coupled with another of the second set of fuses 39, such as the fifth fuse 49, and the third SSPC 34 can be electrically coupled with yet another of the second set of fuses 39, such as the sixth fuse 51. In one non-limiting aspect of the disclosure, the second set of fuses 39 can be selected or operably configured to operate according to a common fuse rating characteristic, such as 10 Amperes or 20 Amperes. In another non-limiting aspect, the second set of fuses 39 can be selected or configured to operate at a set of dissimilar fuse ratings based on the desired electrical operation of the power distribution system 23, such as intermixing 10 Ampere fuses and 20 Ampere fuses. In yet another non-limiting aspect of the disclosure, the second set of fuses 39 can have a lower rating than the first set of fuses 31, such that at least a subset of fuses 47, 49, 51 are expected to trip prior to tripping an upstream fuse 45.

In one non-limiting illustrated aspect of the disclosure, the set of SSPCs 30, 32, 34 or a subset of the SSPCs 30, 32, 34 can respectively include a SSPC control logic unit 36, a switchable element 40 configured to selectively connect or enable power transmission from the power source 25 or power received at the input 37 to a downstream set of power outputs. The set of SSPCs 30, 32, 34 or a subset of the SSPCs 30, 32, 34 can optionally include a power feedback sensor, illustrated as a set of respective current sensors 38. As illustrated, the SSPC control logic units 36 can be communicatively connected with the optional respective current sensor 38 (if present) and with the respective switchable element 40. The set of SSPC control logic units 36 can be configured to selectively operate the respective set of switchable elements 40 in accordance with a program or set of executable code. In another aspect of the disclosure, one or more of the SSPCs 30, 32, 34 can be operably controllable by a digital or analog controllable logic element, including but not limited to, a programmed or programmable field gate array (i.e. "FPGA"), digital logical function, analog computational function, or combination or enabling elements thereof.

Non-limiting aspects of the disclosure can be included wherein the set of SSPC control logic units 36 can be further communicably coupled with the controller module 28 such that the controller module 28 can operably control aspects of the set of SSPCs 30, 32, 34 or set of SSPC control logic units 36, such as selectively enabling or disabling the supplying of power by way of the set of SSPCs 30, 32, 34. In this sense, the controller module 28 can operably implement or enable power management schemes for the power distribution system 23. While the controller module 28 is illustrated remote from the secondary power distribution unit 26, non-limiting aspects of the disclosure can be included wherein the secondary power distribution unit 26 includes the controller module 28, or wherein a controller module 28 can be communicatively connected with a set of secondary power distribution units 26. In another non-limiting aspect of the disclosure, a controller module 28 can operably control a set or subset of secondary power distribution units 26 at a power distribution node 16, or a set or subset of secondary power distribution units 26 coupled with a primary power distribution unit 24.

The set of SSPCs 30, 32, 34 can be operably or electrically connected to a downstream set of respective electrical loads 20. For example, as illustrated, the first SSPC 30 can operably enable a supply of power to a first secondary power distribution output 42 connected with an electrical load 20. In another illustrated example, the second SSPC 32 can operably enable a simultaneous supply of power to a second secondary power distribution output 44 and a third secondary power distribution output 48, which are further connected to respective electrical loads 20. Also shown, the second SSPC 32 can further include a seventh fuse 46 or load fuse disposed between the switchable element 40 and the third secondary power distribution output 48, but not disposed between the switchable element 40 and the second secondary power distribution output 44. Non-limiting aspects of the disclosure can be included wherein the seventh fuse 46 is a lower rated fuse (i.e. fails at a lower fuse rating characteristic, such as a lower voltage, current, or temperature) compared to the fifth fuse 49. Thus, in one non-limiting aspect of the disclosure, the seventh fuse 46 can be disposed such that the failure of the seventh fuse 46 does not interrupt the connection between the power input and the second secondary power distribution output 44.

In yet another illustrated example, the third SSPC 34 can operably enable a simultaneous supply of power to a fourth secondary power distribution output 50 and a fifth secondary power distribution output 54, which are further connected to respective electrical loads 20. Similar to the configuration of the second SSPC 32, as shown, the third SSPC 34 can further include an eighth fuse 52 or load fuse disposed between the switchable element 40 and the fifth secondary power distribution output 54, but not disposed between the switchable element 40 and the fourth secondary power distribution output 50. Non-limiting aspects of the disclosure can be included wherein the eighth fuse 52 is a lower rated fuse (i.e. fails at a lower fuse rating characteristic, such as a lower voltage, current, or temperature) compared to the sixth fuse 51. Thus, in one non-limiting aspect of the disclosure, the eighth fuse 52 can be disposed such that the failure of the eighth fuse 52 does not interrupt the connection between the power input and the fourth secondary power distribution output 50.

The aforementioned configuration of the secondary power distribution unit 26 provides for or enables the supplying of power at a set of respective outputs 42, 44, 48, 50, 54 by way of a set of SSPCs 30, 32, 34. In one aspect, the arrangement of the fourth fuse 47, the first SSPC 30, and the first secondary power distribution output 42 enables a selectively enabled power supply bound by the fuse rating of the fourth fuse 47. In another aspect, the arrangement of the fifth fuse 49, the second SSPC 32, and the third secondary power distribution outlet 44 enables a selectively enabled power supply bound by the fuse rating of the fifth fuse 49. In yet another aspect, the arrangement of the sixth fuse 51, the third SSPC 34, and the fourth secondary power distribution outlet 50 enables a selectively enabled power supply bound by the fuse rating of the sixth fuse 51.

In yet another aspect, the arrangement of the fifth fuse 49, the second SSPC 32, the seventh fuse 46, and the third power distribution outlet 48 enables a selectively enabled power supply bound by the fuse rating of the seventh fuse 46, which is expected to trip prior to tripping of either upstream fuse 45, 49 having a higher fuse rating. Stated another way, the third fuse 45 has a higher fuse rating than the fifth fuse 49, and the third and fifth fuses 45, 49 have independently higher fuse ratings than the seventh fuse 46. In this sense, the seventh fuse 46 can trip and cease the supplying of power to the third secondary power distribution outlet 48 without affecting the selective supplying of power to the second secondary power distribution output 44. Likewise, the arrangement of the sixth fuse 51, the third SSPC 34, the eighth fuse 52, and the fifth power distribution outlet 54 enables a selectively enabled power supply bound by the fuse rating of the eighth fuse 52, which is expected to trip prior to tripping of either upstream fuse 45, 51 having a higher fuse rating. Stated another way, the third fuse 45 has a higher fuse rating than the sixth fuse 51, and the third and sixth fuses 45, 51 have independently higher fuse ratings than the eighth fuse 52. In this sense, the eighth fuse 52 can trip and cease the supplying of power to the fifth secondary power distribution outlet 54 without affecting the selective supplying of power to the fourth secondary power distribution output 50.

In this configuration, the electrical loads 20 can be selectively powered by a set of effective fuse ratings, based on, for instance, a particular set of electrical operating characteristics tailored to the load 20. In one non-limiting aspect of the disclosure, the fourth fuse 47 coupled with the first SSPC 30 can be a ten Amp fuse, providing a ten Amp effective fuse rating for the electrical load 20 connected to the first outlet 42. In another non-limiting aspect of the disclosure, the sixth fuse 51 connected with the third SSPC 34 can include a twenty Amp fuse and the eighth fuse 52 can include a ten amp fuse. In this configuration, the electrical load 20 connected to the fourth outlet 50 can have a twenty Amp effective fuse rating while the electrical load 20 connected to the fifth outlet 54 can have a ten Amp effective fuse rating. While only a single representative electrical load 20 is illustrated connected to each secondary power distribution unit output 42, 44, 48, 50, 54, aspects of the disclosure can include a set of electrical loads 20 connected in series or parallel with the respective outputs 42, 44, 48, 50, 54.

Also shown, the leakage current detector 29 can be connected with the power input area 35 and configured to sense, measure, or receive an indication of current traversing at least a portion of the power input area 35.

Figure 3:
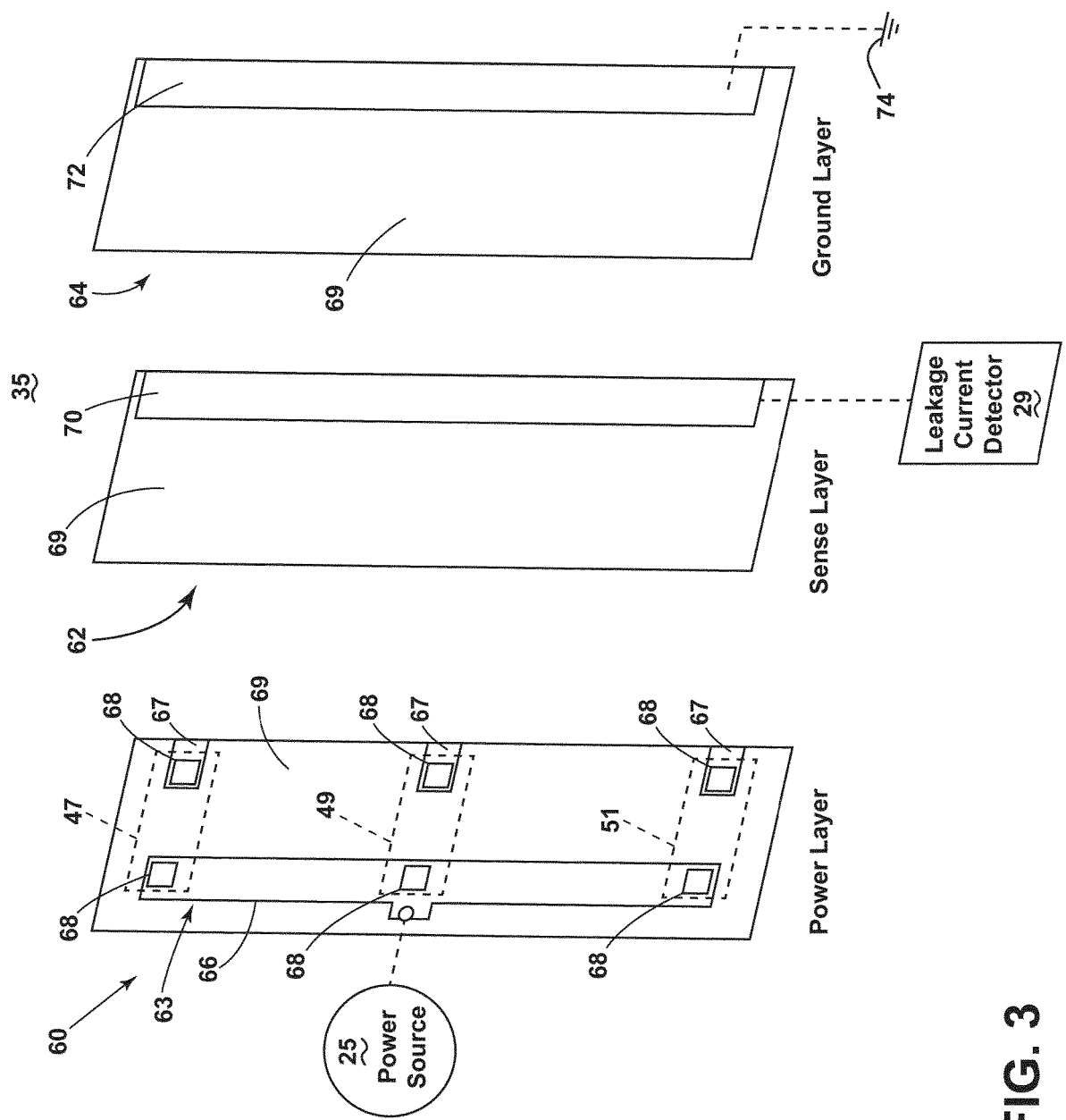
FIG. 3 is an exploded perspective view of a power input area in accordance with various aspects described herein.

FIG. 3 illustrates aspects of the power input area 35 in further detail. As shown, the power input area 35 can include a set of non-conductive PCB or planar circuit board layers, including but not limited to a power layer 60, a sense layer 62, and a ground layer 64. The power layer 60 can include a non-conductive substrate layer 69 supporting a first electrically conductive layer 63 having a first set of conductors 66 electrically connected with the power source 25 and a second set of spaced conductors 67 connected with the respective SSPCs 30, 32, 34 (not shown). The first and second sets of conductors 66, 67 can further include a corresponding set of fuse pads 68 configured to couple with the respective fuses 47, 49, 51 (illustrated in dotted outline).

The first and second sets of conductors 66, 67 are spaced by at least a portion of the non-conductive substrate layer 69 such that the all power delivered from the first set of conductors 66 to the second set of conductors 67 occurs by way of the respective fuses 47, 49, 51, operated as explained above. As explained herein, the first conductive layer 63 or the power layer 60 operably interconnects the power source 25 to the set of electrical components of the secondary power distribution unit 26 or SSPCs 30, 32, 34, which are further selectively connected with the respective electrical loads 20.

The sense layer 62 can include a non-conductive substrate layer 69 supporting a second electrically conductive layer 70 electrically connected with the leakage current detector 29. The ground layer 64 can include a non-conductive substrate layer 69 supporting a third conductive layer 72 electrically connected to electrical ground 74. The second conductive layer 70 and the third conductive layer 72 are disposed on the respective sense layer 62 and ground layer 64 such that, when the layers 60, 62, 64 are overlain, the second and third conductive layers 70, 72 are proximate to the second set of conductors 67 of the power layer 60. As used herein, the conductive layers 63, 70, 72 can include any electrically conductive materials including, but not limited to, metals, alloys, copper, and the like. Non-limiting aspects of the disclosure can be included wherein the only electrically grounded 74 portion of the secondary power distribution unit 26 can be included in the third conductive layer 72 of the ground layer 64. In this sense, the PCB 65 or the layers 60, 62, 64 can be selected, designed, arranged, configured, or enabled such that an electrical grounding path is available for an electrical fault located in the power input area 35, or, in a fault-vulnerable area, by way of the third conductive layer 72.

Figure 4:
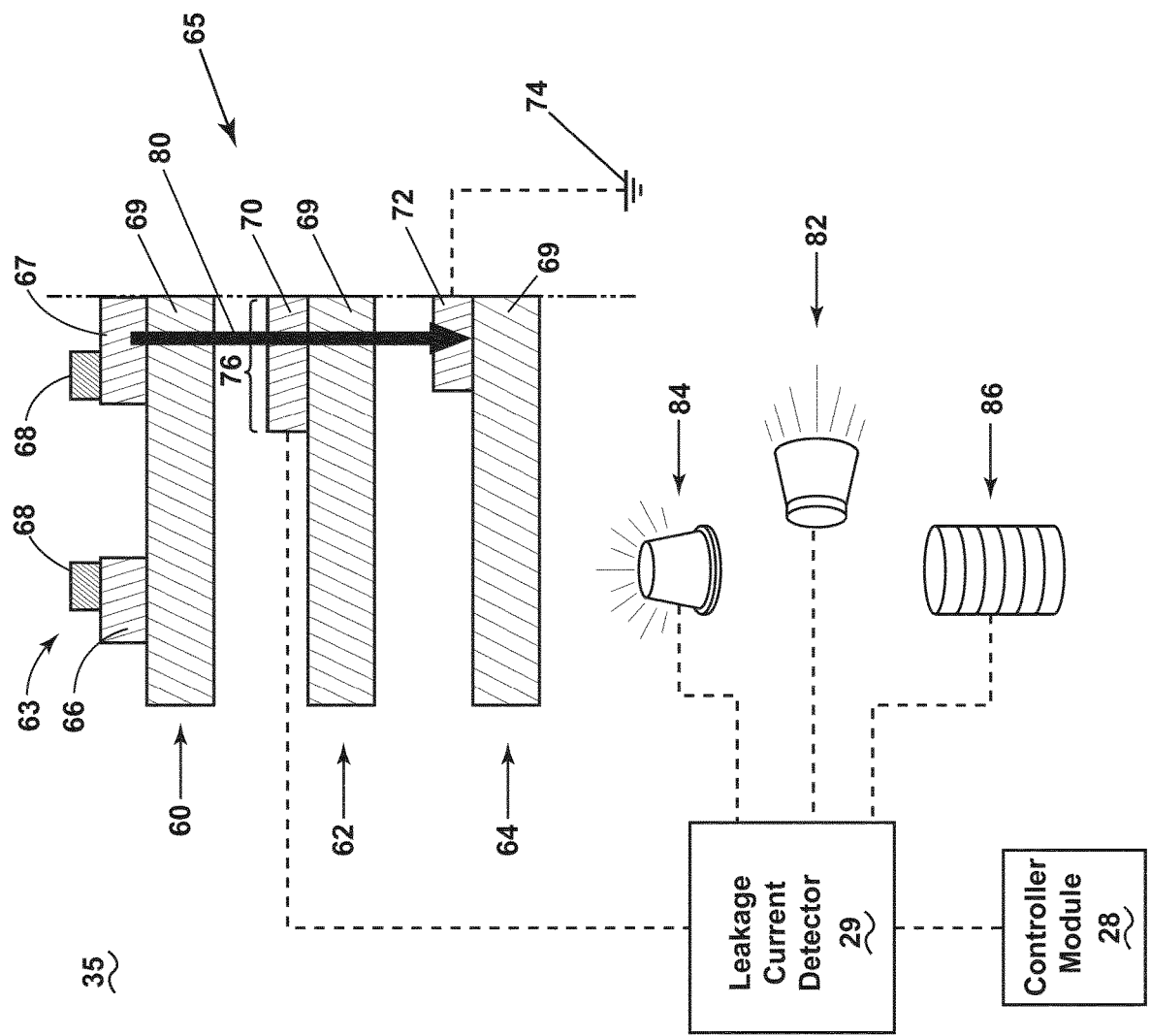
FIG. 4 is a schematic cross-sectional view of the power input area, taken along line IV-IV of FIG. 2 in accordance with various aspects described herein.

FIG. 4 illustrates a schematic cross-sectional view of the assembled or overlain power input area 35, taken along line IV-IV of FIG. 2. As shown, the first conductive layer 63 of the power layer 60 is spaced from the second conductive layer 70 by at least a portion of non-conductive material, such as the non-conductive substrate layer 69. Likewise, the second conductive layer 70 is spaced from the third conductive layer 72 by at least a portion of non-conductive material, such as the non-conductive substrate layer 69.

Also illustrated, the second set of conductors 67, the second conductive layer 70, and the third conductive layer 72 disposed such that the second set of conductors 67 overlays the second conductive layer 70, which further overlays the third conductive layer 72. As shown, non-limiting aspects of the disclosure can be included wherein the second conductive layer 70 can have a larger width 76 compared with the second set of conductors 67 and the third conductive layer 72.

While gaps or spacings are shown separating the layers 60, 62, 64, non-limiting aspects of the disclosure can be included wherein the respective layers 60, 62, 64 directly abut one another to form a substantially uniform planar board structure or integral power input area 45. For instance, the layers 60, 62, 64 can be laminated together, adhered, mechanically fastened, or the like. In another non-limiting aspect of the disclosure, the second conductive layer 70 and third conductive layer 72 can be integrated with or within the respective PCB 65 or non-conductive substrate layer 69, or can be disposed within a depression or channel of the respective non-conductive substrate layer 69 such that the non-conductive substrate layer 69 of the respective layers 60, 62, 64 can directly abut one another. In yet another non-limiting aspect of the disclosure, the second or third conductive layers 70, 72 can be supported by another arrangement of non-conductive substrate layers 69. For example, in a first non-limiting configuration, the underside of the non-conductive substrate layer 69 of the power layer 60 can support the second conductive layer 70. In another non-limiting configuration, the underside of the non-conductive substrate layer 69 of the sense layer 62 can support the third conductive layer 72. Additional configurations can be included.

During operations of the power distribution system 23, power can be selectively supplied from the power source 25 to the electrical loads 20 by way of the secondary power distribution units 26. Also during operations, the non-conductive substrate layers 69 are typically non-conductive, and prevent errant or unintended arcing or electrical faults in the power distribution system 23. However, when heated to a sufficiently high temperature, non-conductive substrate layers 69 can decompose and leave an electrically conductive residue that can cause or lead to errant or unintended arcing or electrical faults in the power distribution system 23. Thus, if an electrical component in the power distribution system 23 exceeds a thermal limit, overheats, or the like, the non-conductive substrate layer 69 or a portion thereof can fail, resulting in the electrical fault.

One non-limiting example electrical fault is illustrated in FIG. 4, wherein a leakage current (illustrated as arrow 80) traverses the second set of conductors 67 of the power layer 60 through the second conductive layer 70 of the sense layer 62, to the electrically grounded third conductive layer 72 of the ground layer 64. In this sense, the lateral disposition of the second conductive layer 70 (and width 76 thereof) between the first conductive layer 63 and the third conductive layer 72 is arranged or configured to ensure the leakage current 80 conductive pathway passes through the second conductive layer 70 on the way to electrical ground 74. In another non-limiting example of an electrical fault, a leakage current can traverse the second set of conductors 67 of the power layer 60 to the second conductive layer 70 of the sense layer 62. In this non-limiting example, the electrical fault does not further traverse to the electrically grounded third layer 72.

The leakage current detector 29 can include electrical or power-sensing componentry to detect, sense, or measure the presence or absence of leakage current 80 or a voltage through the second conductive layer 70 of the sense layer 62, regardless of whether the leakage current 80 traverses to the electrically grounded third layer 72. Non-limiting examples of electrical or power-sensing componentry can include a current sensor, a voltage sensor, or the like. Non-limiting aspects of the leakage current detector 29 can be included wherein the detector 29 is configured to compare a current or voltage value sensed or measured from the second conductive layer 70 to a threshold leakage value. If the sensed or measured current or voltage value exceeds the threshold leakage value, the leakage current detector 29 can be configured to provide a signal indicative of the presence of the leakage current 80.

Non-limiting examples of providing a signal indicative of the presence of the leakage current 80 can include providing an indication of the electrical fault, such as a digital error message, providing an audio indicator such as an audible alarm 82, providing a visual indicator such as a blinking light 84, or providing a signal or message to a user or another system, such as an error logging system 86. In another non-limiting configuration, the leakage current detector 29 can further provide the signal indicative of the presence of the leakage current 80 to the controller module 28, which can further operate the secondary power distribution unit 26 in response to the leakage current 80 indication. For example, the controller module 28 can operably control, permanently disable, or temporarily suspend the operation of a subset of the SSPCs 30, 32, 34 in response to the indication of the presence of leakage current 80 to reduce the impact of any continued electrical fault activity.

While the operations above describe comparing and determining whether a sensed or measured current value exceeds the threshold leakage value, additional non-limiting comparisons or determinations can include instantaneous current, average current, rate of change in current, or the like. Likewise, while the operations above describe comparing and determining whether a sensed or measured voltage value exceeds the threshold leakage value, additional non-limiting comparisons or determinations can include instantaneous voltage, average voltage, of rate of change in voltage.

The threshold leakage value can be based on, for example, a minimum threshold value or level above or unaffected by electrical currents induced due to the proximity of the second conductive layer 70 to the first conductive layer 63, including but not limited to, capacitive coupling or inductive coupling.

Figure 5:
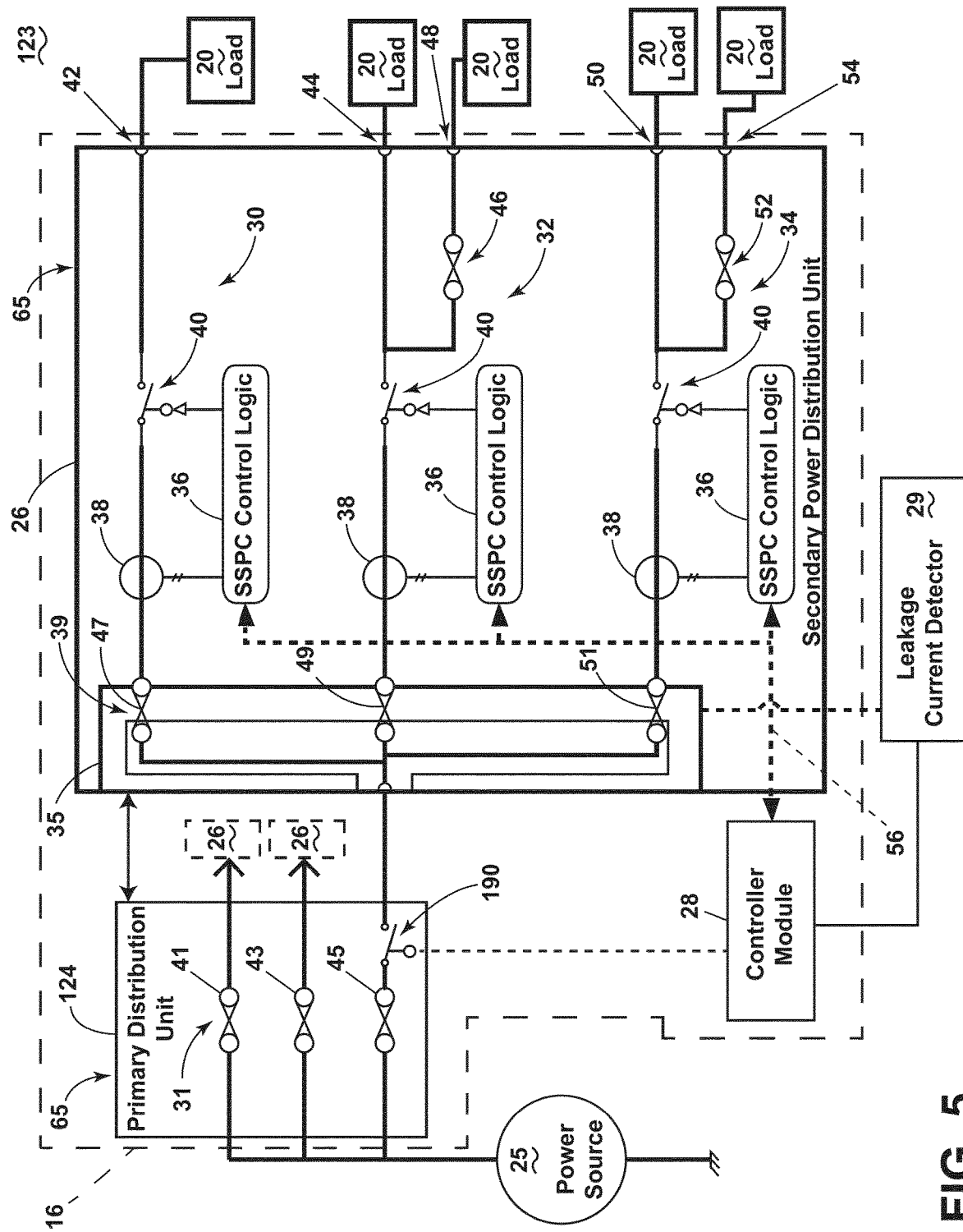
FIG. 5 illustrates an example schematic view of another power distribution system of FIG. 1, in accordance with various aspects described herein.

FIG. 5 illustrates a power distribution system 123 according to another aspect of the present disclosure. The power distribution system 123 is similar to the power distribution system 23; therefore, like parts will be identified with like numerals increased by 100, with it being understood that the description of the like parts of the power distribution system 23 applies to the power distribution system 123, unless otherwise noted. One difference is that the primary power distribution unit 124 can include a switchable element 190 in-line with the electrical pathway connected to the secondary power distribution unit 26. The switchable element 190 can be further controllably connected to the controller module 28. In this configuration, the controller module 28 can operably control, permanently disable, or temporarily suspend the operation of the secondary power distribution unit 26 in response to the indication of the presence of leakage current 80, as described herein, to reduce the impact of any continued electrical fault activity.

Figure 6:
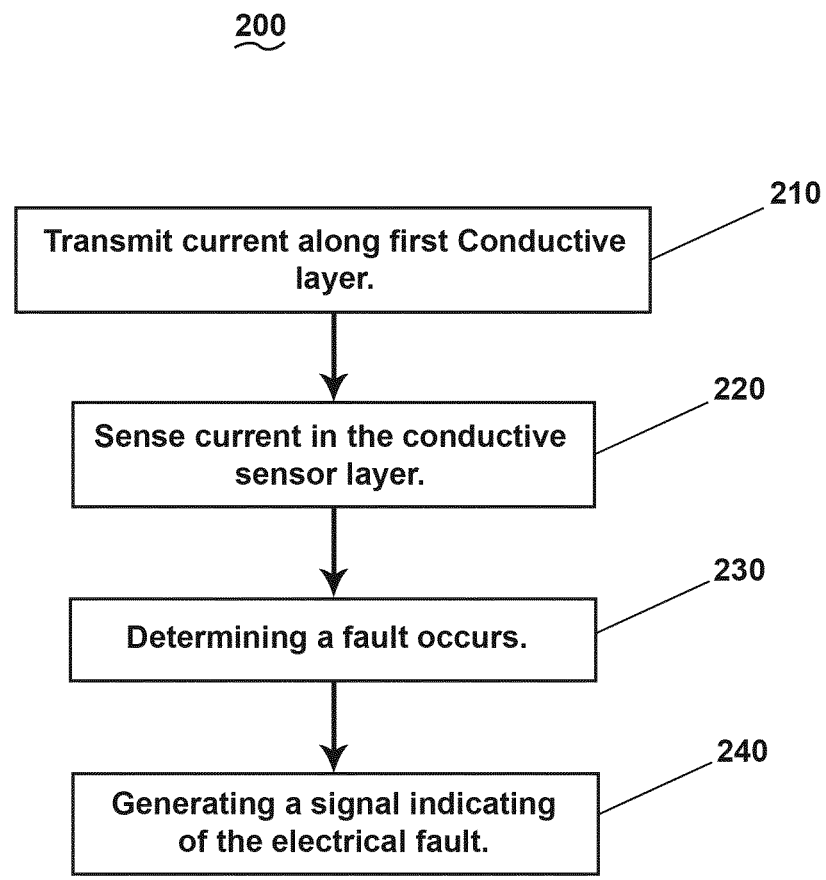
FIG. 6 is an example a flow chart diagram demonstrating a method of detecting an electrical fault in accordance with various aspects described herein.

FIG. 6 illustrates a flow chart demonstrating a method 200 of detecting an electrical fault in a printed circuit board, such as in the secondary power distribution unit 26. The method 200 begins by transmitting a current along the first conductive layer 63 interconnecting a set of electrical components at 210. Next, the method 200 operates by sensing current in the second conductive sensor layer 70 by the leakage current detector 29 connected to the second conductive sensor layer 70 at 220. The leakage current detector 29 the determines that an electrical fault in the printed circuit board occurs between the first conductive layer 63 and the third conductive layer 72 when the sensed current satisfies a fault threshold at 230. Next, the leakage current detector 29 generates a signal indicative of the electrical fault. In one non-limiting aspect of the method 200, the leakage current detector 29 can further cease the transmitting the current along the first conductive layer 63 in response to the generating the signal indicative of the electrical fault. In another non-limiting aspect of the method 200, the ceasing the transmitting of the current can further include controllably operating at least one of a primary distribution power unit 24, 124 upstream of the printed circuit board or controllably operating a solid state power controller 30, 32, 34 of the printed circuit board located electrically in-line with the first conductive layer 63.

The sequence depicted is for illustrative purposes only and is not meant to limit the method 200 in any way as it is understood that the portions of the method can proceed in a different logical order, additional or intervening portions can be included, or described portions of the method can be divided into multiple portions, or described portions of the method can be omitted without detracting from the described method.

Figure 7:
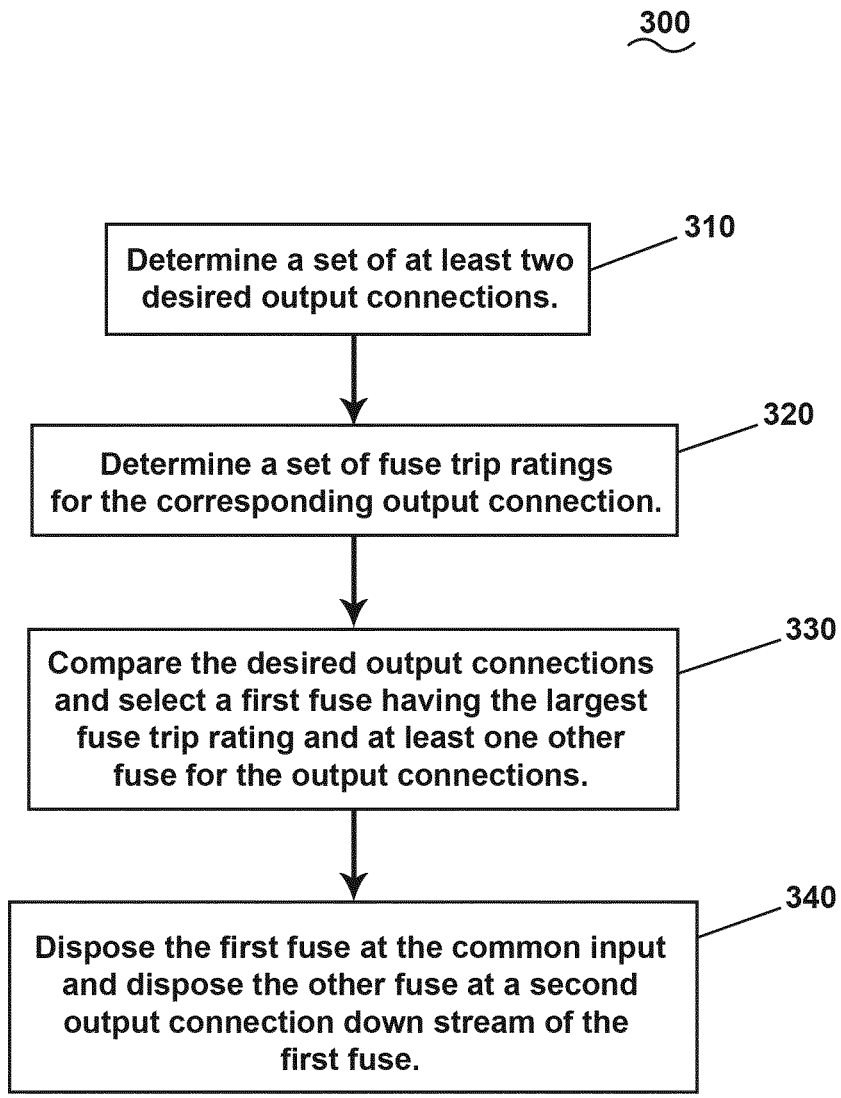
FIG. 7 is an example a flow chart diagram demonstrating a method of arranging fuses in accordance with various aspects described herein.

FIG. 7 illustrates a flow chart demonstrating a method 300 of arranging fuses, such as in the secondary power distribution unit 26. The method 300 begins by determining a set of at least two desired output connections of a circuit having a common input at 310. In one non-limiting example, the at least two desired output connections can include the second secondary power distribution output 44 and the third secondary power distribution output 48. Next, the method 300 operates by determining a set of fuse trip ratings for the corresponding set of at least two desired output connections at 320. The method 300 proceeds by comparing the set of electrical characteristics for the set of at least two desired output connections and selecting a first fuse, such as the fifth fuse 49, corresponding to a first desired output connection (e.g. second secondary power distribution output 44) having the largest determined fuse trip rating and at least one other fuse, such as the seventh fuse 46, corresponding to a second desired output connection (e.g. third secondary power distribution output 48), at 330. As explained herein, the at least one other fuse (e.g. the seventh fuse 46) has a lower fuse trip rating than the first fuse (e.g. the fifth fuse 49). Next, the method 300 includes disposing the first fuse at the common input and disposing the at least one other fuse at the second desired output connection, downstream of the first fuse, at 340, as described herein.

The sequence depicted is for illustrative purposes only and is not meant to limit the method 200 in any way as it is understood that the portions of the method can proceed in a different logical order, additional or intervening portions can be included, or described portions of the method can be divided into multiple portions, or described portions of the method can be omitted without detracting from the described method. For example, in one non-limiting aspect of the disclosure, the disposing at 340 can include disposing at least the one other fuse in electrical parallel with the first desired output connection.

Many other possible embodiments, aspects, and configurations in addition to that shown in the above figures are contemplated by the present disclosure. For example, it is envisioned that aspects of the invention can be included at multiple points of a power distribution system such that a particular point or segment comprising the electrical failure can be determined, and, for instance, a power supply can be rerouted through an alternative electrical path to reach the electrical loads 20. The thresholds described herein can be estimated, arbitrarily set, determined empirically, or be defined with reference to an existing value (e.g. 2 volts above or below the moving average of the output voltage). Additionally, the design and placement of the various components can be rearranged such that a number of different in-line configurations could be realized.

Additionally, aspects of the PCB 65 or non-conductive substrate layers 69 layout design can be selected such that the power layer 60 or additional conductive PCB layers can form or include guard tracks or areas connected to the sense layer 62 by vias or equivalent. Guard tracks and areas can be utilized when the power layer 60 includes a set of power levels operating at dissimilar electrical characteristics, such as at different voltage levels. In yet another aspect of the disclosure, the second conductive layer 70 can include a fusible conductive mesh such that a sustained current flow greater than, in one non-limiting example, 10 milliamps, the conductive mesh would fuse, for example, after triggering the leakage current detection mechanism or after transmitting a signal to the leakage current detector 29, without allowing for additional PCB 65 destruction. In yet another aspect of the disclosure, at least one of the power layer, the sense layer, or ground layer can be included along the entire PCB 65, and thus, would not be limited to the power input area.

In yet another aspect of the disclosure, a PCB 65 can include more substrate layers 69 having additional conductive pathways, and aspects of the aforementioned disclosure can be included in a number of different configurations of the additional substrate layers 69.

The aspects disclosed herein provide an apparatus and method for detecting electrical faults in a circuit. Aspects of the disclosure enable or provide for PCB insulation breakdown detection achieved by adding additional conductive areas to the PCB which are connected to a detection circuit. These areas are strategically designed to be able to be in close proximity to high power track and plane areas so that early degradation of the insulation will result in a leakage current to the detection circuit which can trigger appropriate protective action. Additionally, by disposing the highest rated fuse per SSPC to an alternate circuit position at the power input to the PCB, the fuses can fulfil their original role as well as protection against PCB or PCB substrate layer faults. Non-limiting aspects of the disclosure can be included wherein the power input area configuration or the disposing of the highest rated fuse upstream of the respective SSPC can be implemented independently of one another.

A beneficial effect is that the above described aspects enable the detecting or confirming of electrical faults in a circuit, and providing indication of the detection or confirmation of such faults. One advantage that can be realized in the above aspects is that the above described aspects provide for active detection of electrical faults in a power distribution system. Circuits used to control or transform high power for external loads are difficult to protect because the fault or leakage current may be capable of generating a large amount of heat in the vicinity of the PCB, yet be small compared to the current level delivered to the loads, and hence unlikely to be detected by an overcurrent trip or fuse Yet another advantage of the disclosure is the configuration of the highest rated fuse per SSPC to an alternate circuit position upstream of the SSPC at the power input to the PCB. By arranging the physical position of these fuses, power input connection and PCB conductor patterns as described in this disclosure, the fuses continue to fulfil their original role as well as protection against PCB or PCB substrate layer faults. This has the capability of detecting a relatively small leakage currents which can result in much earlier detection that is not dependent upon the fault path impedance falling to the level that would blow the supply fuse. As used herein, "relatively small" can be relative to the input power supply; for example, 10 A is relatively small to a 100 A power supply or power input. In another non-limiting example, 10 mA is relatively small.

Another advantage of the above described aspects is that leakage current detector in one or more electrical systems can be able to precisely define where an electrical fault is taking place. This can allow for a very robust system wherein electrical faults can be quickly located (and safely interrupted) due to the proximity of one or more arc leakage current detectors to any given failure point. Additionally, by locating the point of failure, the system can allow for rerouting of power around the fault (if available), providing redundancy in the electrical network. The above described aspects, thus, provide for increased safety for an aircraft electrical power distribution system and hence improve the overall safety of the aircraft and air travel. Furthermore, precisely defining where an electrical fault is taking place reduces or eliminates any additional maintenance time or costs associated with having to manually test and locate the electrical failure.

Yet another advantage of the above described aspects is that the arrangement of the various fuses describe herein allows for, enables, or provides for a redundant electrical fault protection in addition to the SSPC tripping control, or can replace the SSPC tripping control, as described herein. Additionally, by locating at least a subset of the fuses to the input side of the secondary power distribution unit can allow or provide for the internal connections, such as the PCB tracks or the like, can be fused at a lower current than conventional power distribution units. In the event of an electrical fault, the reduced fusing current can reduce the extent of destruction. In yet another advantage, the above described aspects provide for electrical fault protection and current sinking at early fault stages or states, possibly even prior to an observer noticing said fault.

To the extent not already described, the different features and structures of the various aspects can be used in combination with each other as desired. That one feature cannot be illustrated in all of the aspects is not meant to be construed that it cannot be, but is done for brevity of description. Thus, the various features of the different aspects can be mixed and matched as desired to form new embodiments, whether or not the new embodiments are expressly described. Combinations or permutations of features described herein are covered by this disclosure.

This written description uses examples to disclose embodiments of the invention, including the best mode, and also to enable any person skilled in the art to practice embodiments of the invention, including making and using any devices or systems and performing any incorporated methods. The patentable scope of the invention is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

What we claim is:

1. A power distribution node comprising:
a first conductive layer interconnecting a set of electrical components and having a first electric potential;
a second conductive layer connected to a second electrical potential different from the first conductive layer;
a third conductive sense layer between the first and second conductive layers;
wherein non-conductive material separates the first conductive layer from the third conductive sense layer, and the third conductive sense layer from the second conductive layer; and
a fault detection circuit electrically connected to the third conductive sense layer and configured to send a signal representative of a fault when a current traversing the non-conductive material reaches the third conductive sense layer;
a power input area configured to receive power from a power input and provide the power to the first conductive layer; and
a set of fuses serially arranged between the power input and an electrical load, and comprising:
a first fuse located upstream the power input area;
a second fuse located within the power input area; and
a third fuse located downstream the second fuse;
wherein the first fuse has a higher rating than the second fuse, which has a higher rating than the third fuse.

2. The power distribution node of claim 1, further including a solid state power controller electrically connected to the first conductive layer and operably configured to selectively enable energizing the electrical load.

3. The power distribution node of claim 2, further including a controller module configured to selectively operate the solid state power controller to enable the energizing of the electrical load.

4. The power distribution node of claim 3, wherein the fault detection circuit is communicatively connected to the controller module, and wherein controller module is configured to operate the solid state power controller based at least on the signal representative of a fault.

5. The power distribution node of claim 1, wherein the first electric potential includes a first alternating current, and wherein the second electric potential includes a second alternating current different from the first alternating current.

6. The power distribution node of claim 1, further comprising a first power distribution output serially connected to the power input area through a first transmission line and a second transmission line branching, and a second power distribution output serially connected to the power input area through the first transmission line and a third transmission line, wherein the second transmission line and the third transmission line each separately branch off from the first transmission line.

7. The power distribution node of claim 6, wherein the third fuse is disposed on the second power distribution output, such that failure of the third fuse does not interrupt the connection between the first power distribution output and the power input area.

8. The power distribution node of claim 1, wherein the power input area includes the first conductive layer, the second conductive layer, and the third conductive sense layer.

9. The power distribution node of claim 1, wherein the fault detection circuit is configured to compare the current reaching the third conductive sense layer with a fault detection threshold.

10. The power distribution node of claim 1, wherein at least a portion of the first conductive layer laterally overlies at least a portion of the second conductive layer, and wherein the portion of the first conductive layer laterally overlying the portion of the second conductive layer also laterally overlies at least a portion of the third conductive sense layer.

11. A printed circuit board comprising:
a first conductive layer interconnecting a set of electrical components;
a second conductive layer connected to an electrical ground;
a third conductive sense layer between the first and second conductive layers;
wherein non-conductive material separates the first conductive layer from the third conductive sense layer, and the third conductive sense layer from the second conductive layer; and a fault detection circuit electrically connected to the third conductive sense layer and configured to send a signal representative of a fault when a current traversing the non-conductive material reaches the third conductive sense layer;

a power input area configured to receive power from a power input and provide the power to the first conductive layer, wherein the power input area includes a first fuse;

a first power distribution output serially connected to the power input area through a first transmission line and a second transmission line; and a second power distribution output, separate from the first power distribution output, serially connected to the power input area through the first transmission line and a third transmission line having a second fuse;

wherein the first fuse has a higher rating than the second fuse, such that failure of the second fuse does not interrupt the connection between the first power distribution output and the power input area, wherein the second transmission line and the third transmission line each separately branch off from the first transmission line, and wherein the second transmission line does not include a fuse.

* * * * *